United States Patent
Kuhwald

(10) Patent No.: US 8,126,256 B2
(45) Date of Patent: Feb. 28, 2012

(54) DEVICE AND METHOD FOR ANALYSIS OF SIGNAL CHARACTERISTICS WITH THE USE OF MASKS

(75) Inventor: Thomas Kuhwald, Markt Schwaben (DE)

(73) Assignee: Rohde & Schwarz Gmbh & Co. KG, Munich (DE)

( * ) Notice: Subject to any disclaimer, the term of this patent is extended or adjusted under 35 U.S.C. 154(b) by 442 days.

(21) Appl. No.: 12/439,317

(22) PCT Filed: Jul. 24, 2007

(86) PCT No.: PCT/EP2007/006569
§ 371 (c)(1),
(2), (4) Date: Feb. 27, 2009

(87) PCT Pub. No.: WO2008/028537
PCT Pub. Date: Mar. 13, 2008

(65) Prior Publication Data
US 2010/0002906 A1    Jan. 7, 2010

(30) Foreign Application Priority Data
Sep. 6, 2006 (DE) .......... 10 2006 041 824

(51) Int. Cl.
*G06K 9/00* (2006.01)

(52) U.S. Cl. ............. 382/144; 702/67; 702/73; 702/74

(58) Field of Classification Search .......... 382/144; 702/66–71, 73, 74; 345/440.01, 694, 440.1
See application file for complete search history.

(56) References Cited

U.S. PATENT DOCUMENTS

| | | | |
|---|---|---|---|
| 3,811,040 A | | 5/1974 | Weinfurt et al. |
| 5,337,403 A | * | 8/1994 | Klingman ............ 345/440 |
| 5,929,842 A | * | 7/1999 | Vertregt et al. ............ 345/690 |
| 6,104,374 A | * | 8/2000 | Sullivan et al. ............ 345/694 |
| 6,252,608 B1 | * | 6/2001 | Snyder et al. ............ 345/473 |
| 6,642,926 B1 | * | 11/2003 | Letts ............ 345/440.1 |
| 6,728,648 B1 | * | 4/2004 | Letts ............ 702/71 |
| 6,778,931 B1 | * | 8/2004 | Letts et al. ............ 702/117 |
| 6,785,540 B1 | | 8/2004 | Wichelman |
| 6,804,633 B2 | * | 10/2004 | Nygaard, Jr. ............ 702/189 |
| 7,434,113 B2 | * | 10/2008 | Miller et al. ............ 714/700 |
| 7,437,624 B2 | * | 10/2008 | Miller et al. ............ 714/700 |
| 7,634,693 B2 | * | 12/2009 | Miller et al. ............ 714/700 |

FOREIGN PATENT DOCUMENTS

| | | |
|---|---|---|
| EP | 0235911 A2 | 9/1987 |
| EP | 0677746 A2 | 10/1995 |
| EP | 1094320 A2 | 4/2001 |
| JP | 2116757 A | 5/1990 |
| JP | 02116757 A | 5/1990 |
| JP | 0599965 A | 4/1993 |

* cited by examiner

OTHER PUBLICATIONS

International Preliminary Report on Patentability, PCT/EP2007/006569, Apr. 16, 2009, pp. 1-9.

*Primary Examiner* — Roy M Punnoose
(74) *Attorney, Agent, or Firm* — Ditthavong Mori & Steiner, P.C.

(57) ABSTRACT

An analysis device for analyzing a signal characteristic with the use of a mask. The analysis device includes a buffer device for the provision of a signal-image address of a signal-image point of a signal image and for the provision of a mask-image address of a mask-image point of a mask image and a comparison device for the comparison of the signal-image address and the mask-image address.

21 Claims, 2 Drawing Sheets

DEVICE AND METHOD FOR ANALYSIS OF SIGNAL CHARACTERISTICS WITH THE USE OF MASKS

CROSS-REFERENCE TO RELATED APPLICATION

The present application claims priority to PCT Application No. PCT/EP2007/006569, filed on Jul. 24, 2007, and German Patent Application No. 10 2006 041 824.7, filed on Sep. 6, 2006, the entire contents of which are herein incorporated by reference.

BACKGROUND OF THE INVENTION

1. Field of the Invention

The present invention relates to the analysis of signal characteristics with the use of masks.

2. Discussion of the Background

If signal characteristics (curve characteristics) of serial data streams are analyzed, for example, with the use of an oscilloscope, it is often necessary to test the signal characteristic against specified mask regions. In this context, the signal characteristic must not contact or not intersect the mask characteristic or the mask, or, in the case of tolerance bands, must not leave the mask region. Typically, such tests are specified within the framework of compliance tests for serial interfaces and data transmission systems.

The mask testing is typically implemented on the basis of the image points, which are stored in an image buffer (display-buffer). The image points can be signal-image points, which are registered through an oscilloscope, converted into image points and stored in the image buffer, as described, for example in EP 677 746 A2. However, if the signal characteristic is composed, for example, of lines, a mask testing of this kind is costly, because every signal-image point must be set and tested individually. Furthermore, in the case of a direct testing, a large memory is required for storing the masks in an image buffer.

SUMMARY OF THE INVENTION

Embodiments of the present invention advantageously provide an efficient device and an efficient method for analyzing a signal characteristic with the use of a mask.

Embodiments of the invention are based upon the knowledge that an efficient analysis of a signal characteristic with reference to a mask can be implemented on the basis of addresses of the signal-image points buffered in an image buffer. In this context, the invention exploits the fact that the previously-registered signal characteristic is present in an image buffer, wherein an image address (for example, a pixel address comprising a row and/or column number) is allocated to a signal-image point.

The mask can also be presented graphically through a plurality of mask-image points, wherein the mask-image points are allocated to image rows or image columns. With an allocation of this kind, every mask-image point can be localized through an image address (for example, a row number, a column number). According to embodiments of the invention, however, the mask testing is implemented on the basis of the image addresses of the mask-image points and the image addresses of the signal points, because it can already be determined on the basis of an address comparison, whether a signal-image point is disposed, for example, above or below a mask-image point arranged in the same image row and/or image column, thereby quickly and efficiently determining a mask violation.

Embodiments of the present invention provide an analysis device for analyzing a signal characteristic with the use of a mask, wherein the signal characteristic can be represented or displayed graphically through a signal image, and the mask characteristic through a mask image (for example, as a sequence of voltage or current values).

The analysis device comprises a buffer device for the provision of a signal-image address of a signal-image point of the signal-image and for the provision of a mask-image address of a mask-image point of the mask image. Furthermore, a comparison device for the comparison of the signal-image address and the mask-image address is provided, wherein, according to one aspect, the comparison device can determine an arrangement of the signal-image point with reference to the mask-image point.

According to one aspect, the buffer device can comprise an image buffer for buffering the signal-image point and a mask buffer for buffering the mask-image address of the mask-image point. The image buffer and the mask buffer preferably provide different buffer ranges.

The mask buffer can be, for example, a volatile or a non-volatile buffer, in which one or more mask-image addresses can be buffered, for example, permanently. The mask-image address can provide an image-row number and/or an image-column number, which are allocated to an image row or respectively an image column. The mask-image address defines, for example, a mask-image range, above or below which a tolerance range is determined, within which the arrangement of the signal-image point is permissible (no mask violation) or non-permissible (mask violation). The signal-image address of the signal-image point in this context can be presented or buffered in the form of a line number and/or a column number.

Moreover, the analysis device comprises a comparison device for the comparison of the signal-point address with the mask-image address, for example, in order to determine a relative arrangement of the signal-image point with reference to the mask-image point.

The arrangement of the signal-image point with reference to the mask-image point, may be a specification regarding whether the signal-image point is disposed above or below the mask-image point or whether the signal-image point and the mask-image point coincide. The comparison device can determine on the basis of the arrangement of the signal-image point with reference to the mask-image point whether the signal-image point is disposed inside or outside a mask range specified by the mask-image point or by the mask. According to one aspect, the comparison device can output a comparison signal, which indicates the arrangement of the signal-image point with reference to the mask-image point and with reference to the mask range.

Moreover, according to one aspect, the buffer device can provide a further mask-image address, which is allocated to a further mask-image point. Through the mask-image point and through the further mask-image point, a mask-image-point pair can be presented, which determines a tolerance range (for example, a tolerance band), inside or outside of which an arrangement of the signal-image point is permissible or non-permissible. The comparison device can compare the signal-image address of the signal-image point with the mask-image address and with the further mask-image address, in order to determine the arrangement of the signal-image point with reference to the mask-image point and the further mask-image point. Furthermore, the analysis device can determine on the basis of the comparison, whether the signal-image point is disposed inside or outside the mask range specified by the mask-image-point pair.

For example, the signal-image point, the mask-image point and the further mask-image point are arranged within the same image row or within the same image column. The mask-image-point pair accordingly determines a mask range within this image row or this image column. The extension of the mask within the relevant image row or image column is determined through the mask-image points.

The comparison device can determine on the basis of one or more of the following relational comparisons, whether a mask violation is present or not. For example, a mask violation is not present, if:

$m_{start} < y_{start}$ and $m_{end} < y_{start}$ and/or $m_{start} > y_{end}$ and $m_{end} > y_{end}$ and/or $m_{start} \leq y_{start}$ and $m_{end} \geq y_{end}$.

In this context, $m_{start}$ denotes a mask-image address of a mask-image point (for example, a start-point of a mask range), $m_{end}$ denotes a further mask-image address of a further mask-image point (for example, an end-point of the mask range), $y_{start}$ denotes a signal-image address of a signal-image point (for example, a start-point of a signal range), and $y_{end}$ denotes a further signal-image address of a further signal-image point (for example, an end-point of the signal range).

Furthermore, the buffer device can provide a plurality of mask-image-address pairs. Each mask-image-address pair is preferably allocated to an image column or an image row and defines, for example, an image-column range or an image-row range, within which the mask extends. The comparison device can compare one or more signal-image addresses with the mask-image-address pairs in order to determine whether the signal characteristic is disposed inside or outside the tolerance range.

According to a further aspect, the analysis device comprises a registration device for the registration of the signal characteristic (for example, through a measurement) and a calculation device for the calculation of the signal-image addresses from the registered signal characteristic. The calculation device maps, for example, the measured signal-characteristic values onto an image raster, wherein the respective image-raster addresses can be provided as signal-image addresses and/or buffered.

Moreover, the invention provides an analysis method for the analysis of a signal characteristic with the use of a mask, wherein the signal characteristic can be represented graphically through a signal image and wherein the mask can be represented graphically through a mask image, wherein the mask-image address of a mask-image point of the mask image and a signal-image address of a signal-image point of the signal image are provided, and wherein the signal-image address and the mask-image address are compared in order to determine an arrangement of the signal-image point with reference to the mask-image point. Furthermore, the signal-image point can be provided in an image buffer, and the mask-image address can be provided in a mask buffer. According to one aspect, the signal-image address is provided on the basis of the signal-image point.

According to one aspect, it is determined on the basis of the arrangement of the signal-image point with reference to the mask-image point, whether the signal-image point is disposed inside or outside and mask range specified by the mask.

According to one aspect, a further mask-image address of a further mask-image point is provided, wherein the signal-image address is compared with the mask-image address and with the further mask-image address in order to determine the arrangement of the signal-image point with reference to the mask-image point and with reference to the further mask-image point.

According to one aspect, it is determined on the basis of the arrangement of the signal-image point with reference to the mask-image point and the further mask-image point, whether the signal-image point is disposed inside or outside a tolerance range specified by the mask-image point and by the further mask-image point.

According to one aspect, it is determined that no mask violation is present, if one or more of the following conditions is/are fulfilled:

$m_{start} < y_{start}$ and $m_{end} < y_{start}$ or $m_{start} > y_{end}$ and $m_{end} > y_{end}$ or $m_{start} \leq y_{start}$ and $m_{end} \geq y_{end}$.

In this context, $m_{start}$ denotes a mask-image address of a mask-image point, $m_{end}$ denotes a further mask-image address of a further mask-image point, $y_{start}$ denotes a signal-image address of a signal-image point, and $y_{end}$ denotes a further signal-image address of a further signal-image point.

According to one aspect, a plurality of mask-image-address pairs, wherein a mask-image-address pair comprises a mask-image address and a further mask-image address and determines a mask range within an image column or an image row, and a plurality of signal-image addresses, wherein a signal-image address is allocated to a signal-image point in an image column or in an image row, are presented. Furthermore, in each case, a signal-image address, which is allocated to a signal-image point allocated to an image row or image column, is compared with a mask-image-address pair allocated to this image column or this image row in order to determine an arrangement of the signal-image point with reference to the mask range.

According to a further aspect, the signal characteristic is registered, wherein the signal-image address is calculated from the registered signal characteristic.

Moreover, an embodiment of the present invention also relates to a storage medium and a computer program for the execution of the analysis method according to the invention when the computer program is run on computer. According to a further aspect, an embodiment of the invention provides a storage medium and a computer software product with a program code stored on a storage medium, for example, on a diskette or a CD for the execution of the analysis method according to the invention.

BRIEF DESCRIPTION OF THE DRAWINGS

Further exemplary embodiments of the invention are explained with reference to the drawings. The drawings are as follows.

DETAILED DESCRIPTION OF EXEMPLARY EMBODIMENTS OF THE INVENTION

Figure 1:
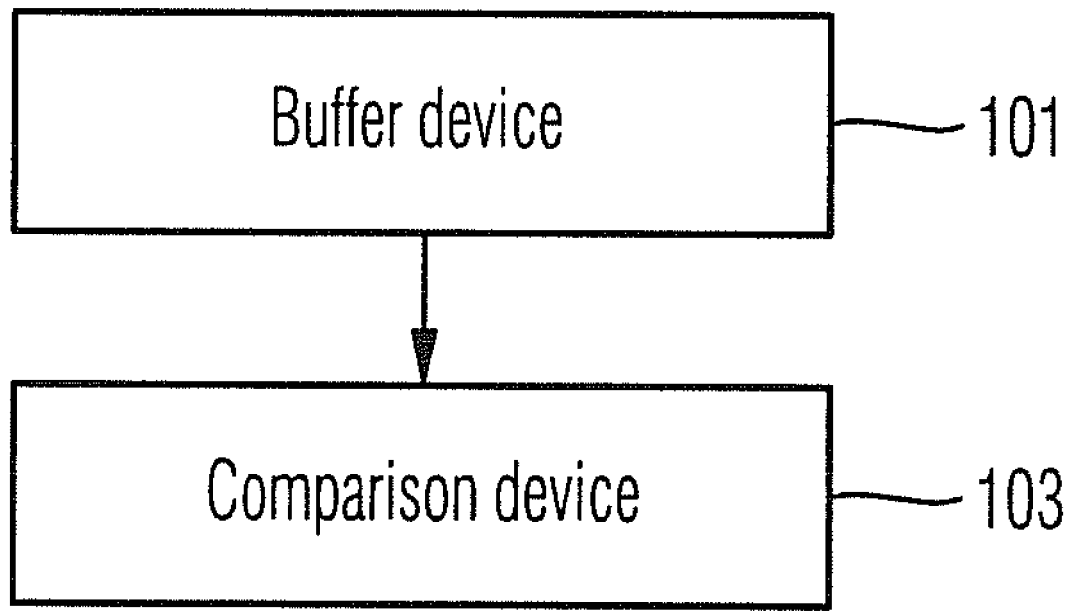
FIG. 1 shows a block diagram of an analysis device.

FIG. 1 shows a block diagram of an analysis device for the analysis of a signal characteristic with the use of a mask. The analysis device comprises a buffer device 101, which is coupled to a comparison device 103.

According to one aspect, the buffer device 101 comprises an image buffer, in which image data can be stored in a differential manner for the mask testing. Furthermore, the buffer device 101 can provide a mask buffer, in which, for example, mask segments can be buffered in the form of mask-image addresses.

The image data (for example, the signal image or the signal characteristic) can be displayed, for example, as lines, wherein the lines are not drawn explicitly in the image buffer. For example, a start-point is marked with +1 and an end-point with −1, wherein the start-point and the end-point can each be represented by a signal-image address and by a further signal-image address. Since several signal characteristics can also be represented in the image buffer one above the other by means of a frequency distribution, the start-point can be read out in each case and incremented, for example, by 1, wherein the end-point is decremented. The actual drawing of the line can then be implemented during the reading out of the pixel columns of the image buffer by forming an integral over the pixel columns. This method supplies an efficient basis for the mask testing.

On the basis of the form according to the invention of the image display, only the start-points or respectively end-points of the lines of a pixel column are known for the mask tests, thereby achieving, for example, a reduction in the buffer size. A simple mask test is possible on the basis of these points.

The mask segments, for example, mask ranges specified through mask-image addresses, for which a test is to be implemented, can also be specified through their start-points or respectively end-points per pixel column (for example, mask-image address of a mask-image point and a further mask-image address of a further mask-image point). These points can be stored in the buffer, which can be organized in columns and can provide the same number of columns as the image buffer. For each column, for example, the start-point and end-point of the mask can be stored within the allocated pixel column.

According to a further aspect, several masks can be used, so that one signal characteristic or several signal characteristics can be tested against a plurality of masks.

Figure 2:
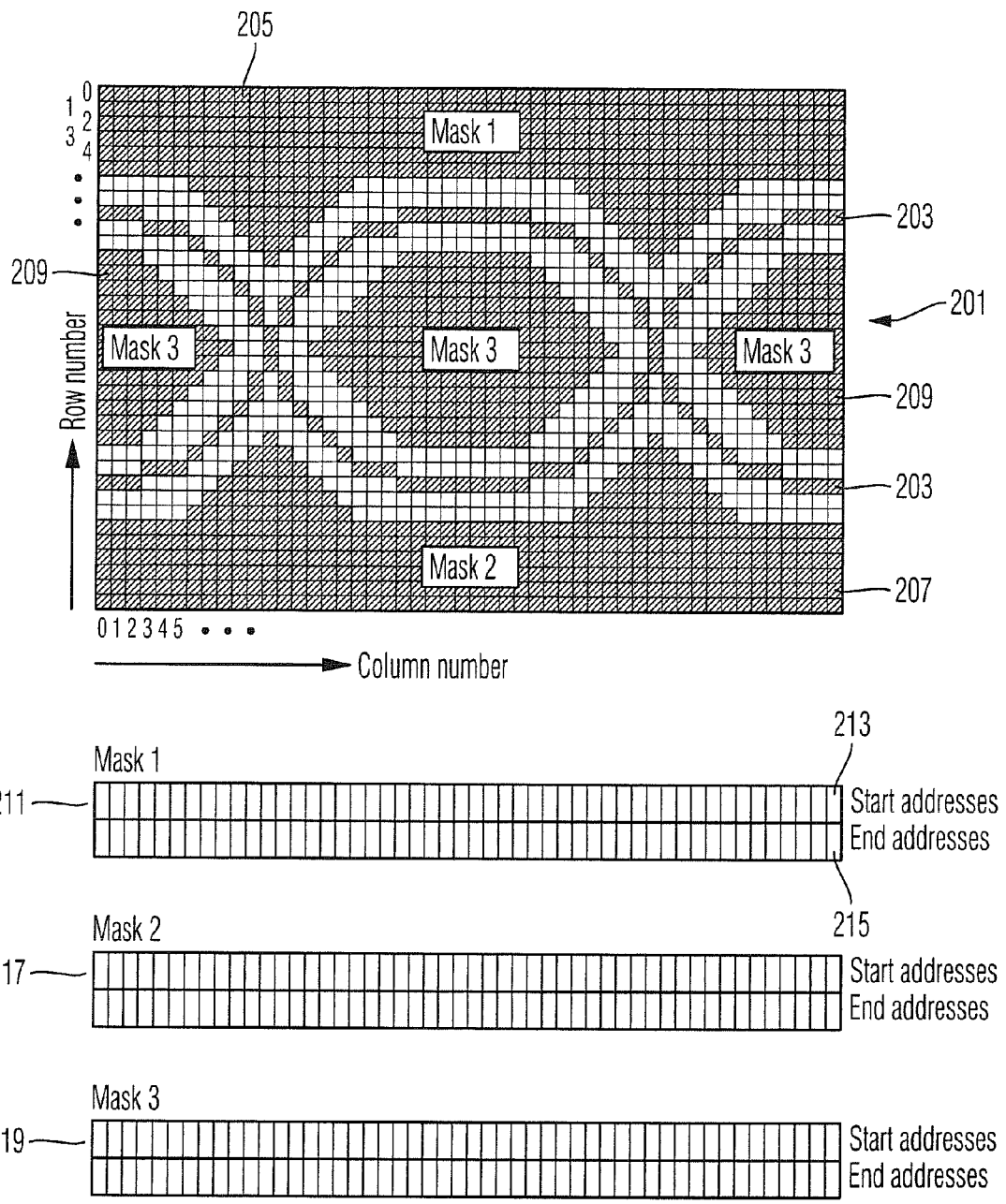
FIG. 2 shows a block diagram of a memory device.

FIG. 2 shows a buffer device with an image buffer 201, which is organized in the form of rows and columns. The rows and the columns can be addressed in each case through a row number and a column number, wherein, for example, the column numbers are incremented in the direction of the horizontal arrow presented in FIG. 2. The row numbers are decremented, for example, in the direction of the vertical arrow presented in FIG. 2. The signal-image points of the signal characteristic 203 can be stored in the image buffer 201, wherein the signal-image address, comprising, for example, a row number and a column number, is allocated to each signal-image point.

According to one aspect, the analysis device comprises a first mask buffer 211, in which, in each case, mask-image-address pairs are buffered in pairs, wherein each mask-image-address pair comprises a start-address and an end-address of the respective mask range capable of being displayed in one column. The mask buffer 211 is organized, for example, in columns and comprises the same number of columns as the image buffer 201. In this context, a mask-image-address pair buffered respectively in a buffer range of the buffer 211 is allocated to each column of the image buffer 201. The start addresses (starting addresses) are buffered, for example, in the buffer ranges 213. The end addresses are buffered, for example, in the buffer ranges 215.

The signal characteristic 203 can be analyzed with reference to a plurality of masks, for example, against a first mask 205, against a second mask 207 or against a third mask 209.

If the signal characteristic 203 or several signal characteristics 203 is/are to be checked against a plurality of masks, the analysis device can, furthermore, provide a plurality of mask buffers, wherein a second mask buffer 217 and a third mask buffer 219 are illustrated by way of example in FIG. 2.

The mask buffer 217 can, for example, buffer or provide the start addresses and the end addresses of the mask-image points of the second mask 207, and the buffer 219 can buffer or provide, for example, the start addresses and the end addresses of the mask-image points of the third mask 209. The mask buffers 217 and 219 are preferably identical in structure to the mask buffer 211.

According to a further aspect, the analysis device can provide exactly the same number of mask buffers as the number of masks to be set up. By means of a mask buffer, for example, an arbitrarily-formed mask can be realised over the entire screen width. In this context, arbitrary means that, for example, only one start-point and one end-point are provided for each column. According to one aspect, the signal characteristic (203) is first registered by a registration device on the basis of a signal registration (for example, measurement), and image points are then calculated on the basis of the registered signal characteristic, which can be set on the basis of the currently-registered signal characteristic or connected as a line.

After the calculation of the image points, the mask testing can be realized as follows:

In a display mode, for example, the respective start-points and end-points of a line can be registered with the assistance of an algorithm and provided with $y_{start}$ and respectively $y_{end}$. For instance, the respective start-point and end-point of the mask is read out from the first mask buffer 211 and provided, wherein the start-point and end-point are marked with $m_{start}$ and respectively $m_{end}$. According to the invention, a mask violation can be tested, for example, on the basis of relational comparisons. If it is determined that:

$$m_{start} < y_{start} \text{ and } m_{end} < y_{start}$$

and/or that $$m_{start} > y_{end} \text{ and } m_{end} > y_{end}$$

apply, no mask violation is present, because the signal characteristic is disposed above or respectively below the mask. If none of the above conditions is fulfilled, a mask violation is present.

If a mask is to be used, for example, as a tolerance band, the following relations can be checked, for example:

$$m_{start} \leq y_{start} \text{ and } m_{end} \geq y_{end}$$

If these relations are fulfilled, no mask violation is present; otherwise, the tolerance band is violated.

According to one aspect, these tests can be implemented separately for all mask ranges. Moreover, the number of image points, which violate the mask, can additionally be determined, for example, on the basis of difference formations. The difference formations can be implemented, for example, by the comparison device.

The invention is not restricted to the exemplary embodiment presented. For example, the masking described can be used not only with signals in the time domain, for example, of an oscilloscope, but also for signals in the frequency domain, for example, of a spectrum analyzer or a network analyzer. All of the features described and/or illustrated can be combined with one another as required within the framework of the invention.

The invention claimed is:

1. An analysis device for analyzing a signal characteristic with a mask, wherein the signal characteristic is represented graphically by a signal image and wherein the mask is represented graphically by a mask image, said analysis device comprising:
    a buffer device configured to provision a signal-image address of a signal-image point of the signal image and configured to provision a mask-image address of a mask-image point of the mask image, and to provide a further mask-image address of a further mask-image point; and
    a comparison device configured to compare the signal-image address with the mask-image address and with the further mask-image address in order to determine an arrangement of signal-image point with reference to the mask-image point and with reference to the further mask-image point,
    wherein the analysis device determines on the basis of the comparison, whether the signal-image point is disposed inside or outside the mask range between the mask-image point and the further mask-image point.

2. The analysis device according to claim 1,
    wherein the buffer device comprises an image buffer configured to buffer the signal-image point and a mask buffer configured to buffer the mask-image address of the mask-image point.

3. The analysis device according to claim 2,
    wherein the image buffer is configured to provide the signal address of the signal-image point.

4. The analysis device according to claim 1,
    wherein the comparison device is configured to determine on the basis of the arrangement of the signal-image point with reference to the mask-image point, whether the signal-image point is disposed inside or outside a mask range specified by the mask.

5. The analysis device according to claim 1,
    wherein the signal-image point, the mask-image point and the further mask-image point are arranged within the same image row or the same image column, and wherein the mask-image point determines a start of a mask range and wherein the further mask-image point determines an end of the mask range disposed within the image row or the image column.

6. The analysis device according to claim 1,
    wherein the comparison device is further configured to determine on the basis of the arrangement of the signal-image point with reference to the mask-image point and the further mask-image point, whether the signal-image point is disposed inside or outside a tolerance range determined by the mask-image point and the further mask-image point.

7. The analysis device according to claim 1,
    wherein the comparison device is configured to determine that no mask violation is present, if one or more of the following conditions is/are fulfilled:

$m_{start} < y_{start}$ and $m_{end} < y_{start}$ or $m_{start} > y_{end}$ and $m_{end} > y_{end}$ or $m_{start} \leq y_{start}$ and $m_{end} \geq y_{end}$, wherein $m_{start}$ denotes a mask-image address of a mask-image point, wherein $m_{end}$ denotes a further mask-image address of a further mask-image point, wherein $y_{start}$ denotes a signal-image address of a signal-image point, and wherein $y_{end}$ denotes a further signal-image address of a further signal-image point.

8. The analysis device according to claim 1,
    wherein the buffer device is configured to provide a plurality of mask-image-address pairs, wherein a mask-image-address pair comprises a mask-image address and a further mask-image address and determines a mask range within an image column or an image row.

9. The analysis device according to claim 1, further comprising a registration device configured to register the signal characteristic and a calculation device for calculating the signal-image address from the registered signal characteristic.

10. An analysis method for analyzing a signal characteristic using a mask, wherein the signal characteristic is represented graphically by a signal image and wherein the mask is represented graphically by a mask image, said method comprising:
    provisioning a mask-image address of a mask-image point of the mask image;
    provisioning a further mask-image of a further mask-image point
        provisioning a signal-image address of a signal-image point of the signal image; and
        comparing the signal-image address with the mask-image address and with the further mask-image address in order to determine the signal-image point with reference to the mask-image point and with reference to the further mask-image point,
    wherein the analysis method determines on the basis of the comparison, whether the signal-image point is disposed inside or outside the mask range between the mask-image point and the further mask-image point.

11. The analysis method according to claim 10, further comprising:
    provisioning the signal-image point in an image buffer; and
    provisioning the mask-image address in a mask buffer.

12. The analysis method according to claim 11, further comprising:
    provisioning the signal-image address on the basis of the signal-image point.

13. The analysis method according to claim 10, further comprising:
    determining on the basis of the arrangement of the signal-image point with reference to the mask-image point, whether the signal-image point is disposed inside or outside a mask range specified by the mask.

14. The analysis method according to claim 10,
    wherein the signal-image point, the mask-image point and the further mask-image point are disposed within the same image row or the same image column, and wherein the mask-image point determines a start and wherein the further mask-image point determines an end of a mask range disposed within the image row or the image column.

15. The analysis method according to claim 10, further comprising:
    determining on the basis of the arrangement of the signal-image point with reference to the mask-image point and the further mask-image point, whether the signal-image point is disposed inside or outside a tolerance range determined by the mask-image point and by the further mask-image point.

16. The analysis method according to claim 11, further comprising:
provisioning a further signal-image address of a further signal-image point; and
comparing the mask-image address with the signal-image address and with the further signal-image address in order to determine the arrangement of the signal-image point and of the further signal-image point with reference to the mask-image point.

17. The analysis method according to claim 10, further comprising:
determining that no mask violation is present, if one or more of the following conditions are fulfilled:

$$m_{start} < y_{start} \text{ and } m_{end} < y_{start}$$

or $$m_{start} > y_{end} \text{ and } m_{end} > y_{end}$$

or $$m_{start} \leq y_{start} \text{ and } m_{end} \geq y_{end},$$

wherein $m_{start}$ denotes a mask-image address of a mask-image point, wherein $m_{end}$ denotes a further mask-image address of a further mask-image point, wherein $y_{start}$ denotes a signal-image address of a signal-image point, and wherein $v_{end}$ denotes a further signal-image address of a further signal-image point.

18. The analysis method according to claim 10, further comprising:
provisioning a plurality of mask-image-address pairs, wherein a mask-image-address pair comprises a mask-image address and a further mask-image address and determines a mask range within an image column or an image row.

19. The analysis method according to claim 10, further comprising:
registering the signal characteristic; and
calculating the signal-image address from the registered signal characteristic.

20. A non-transitory digital storage medium with electronically-readable control signals stored thereon, which can cooperate with a programmable computer or digital signal processor in such a manner that the method according to claim 10 is executed.

21. A computer-software product with program-code means stored on a non-transitory machine-readable medium, in order to implement the steps of the analysis method recited in claim 10, when the program is executed on a computer or digital signal processor.

* * * * *